US010530395B2

(12) United States Patent
Li

(10) Patent No.: US 10,530,395 B2
(45) Date of Patent: Jan. 7, 2020

(54) ITERATIVE MESSAGE-PASSING DECODING WITH GLOBAL CODE EMBEDDED WITH LOCAL CODE IN TIME-DIVISION MANNER FOR FAULT TOLERANCE IMPROVEMENT

(71) Applicant: Alibaba Group Holding Limited, Grand Cayman (KY)

(72) Inventor: Shu Li, Santa Clara, CA (US)

(73) Assignee: ALIBABA GROUP HOLDING LIMITED, Grand Cayman (KY)

( * ) Notice: Subject to any disclaimer, the term of this patent is extended or adjusted under 35 U.S.C. 154(b) by 68 days.

(21) Appl. No.: 15/889,458

(22) Filed: Feb. 6, 2018

(65) Prior Publication Data
US 2019/0245563 A1 Aug. 8, 2019

(51) Int. Cl.
| | |
|---|---|
| *H03M 13/00* | (2006.01) |
| *H03M 13/29* | (2006.01) |
| *H03M 13/15* | (2006.01) |
| *H03M 13/11* | (2006.01) |
| *H03M 13/45* | (2006.01) |
| *H03M 13/41* | (2006.01) |
| *H03M 13/27* | (2006.01) |

(52) U.S. Cl.
CPC ... *H03M 13/2948* (2013.01); *H03M 13/1125* (2013.01); *H03M 13/154* (2013.01); *H03M 13/1515* (2013.01); *H03M 13/27* (2013.01); *H03M 13/4138* (2013.01); *H03M 13/45* (2013.01)

(58) Field of Classification Search
CPC .. H04L 1/005; H04L 1/0057; H03M 13/2948; H03M 13/1125; H03M 13/1515; H03M 13/154; H03M 13/27; H03M 13/4138; H03M 13/45
See application file for complete search history.

(56) References Cited

U.S. PATENT DOCUMENTS

| | | | |
|---|---|---|---|
| 7,447,981 B2 | 11/2008 | Cameron et al. | |
| 7,536,629 B2 | 5/2009 | Shen et al. | |
| 7,549,105 B2 | 6/2009 | Shen et al. | |
| 7,716,553 B2 | 5/2010 | Kim et al. | |
| 8,166,364 B2 | 4/2012 | Patapoutian et al. | |
| 8,707,144 B2 | 4/2014 | Wang et al. | |

(Continued)

*Primary Examiner* — Guerrier Merant
(74) *Attorney, Agent, or Firm* — James J. DeCarlo; Greenberg Traurig, LLP

(57) ABSTRACT

The disclosed embodiments are directed to systems, devices, and methods for iterative message-passing decoding. In one embodiment, a method is disclosed comprising decoding a first codeword at a storage device using a detector and a decoder, the first codeword comprising a set of symbols from a first set of codewords; assigning, via the decoding, a set of confidence levels for each symbol in the first codeword; transmitting, by the storage device, the confidence levels to an iterative decoder; generating, by the iterative decoder, a second codeword based on the set of confidence levels, the second codeword excluding at least one symbol in the set of symbols; and iteratively decoding, by the iterative decoder, the second codeword using an erasure decoder; and transmitting, by the iterative decoder, soft information generated by the erasure decoder to the storage device for subsequent decoding by the storage device.

18 Claims, 7 Drawing Sheets

(56) References Cited

U.S. PATENT DOCUMENTS

| | | |
|---|---|---|
| 8,775,896 B2 | 7/2014 | Li et al. |
| 8,887,020 B2 | 11/2014 | Shokrollahi |
| 9,048,867 B2 | 6/2015 | Liu et al. |
| 9,048,870 B2 | 6/2015 | Li et al. |
| 9,077,378 B2 | 7/2015 | Wu |
| 9,112,530 B2 | 8/2015 | Gunnam et al. |
| 9,130,589 B2 | 9/2015 | Li et al. |
| 9,559,725 B1 | 1/2017 | Shao et al. |
| 2008/0235561 A1* | 9/2008 | Yang .................. H04L 1/005 714/801 |
| 2009/0249163 A1 | 10/2009 | Ovchinnikov et al. |
| 2010/0241923 A1 | 9/2010 | Wang et al. |
| 2016/0197703 A1 | 7/2016 | Park et al. |

* cited by examiner

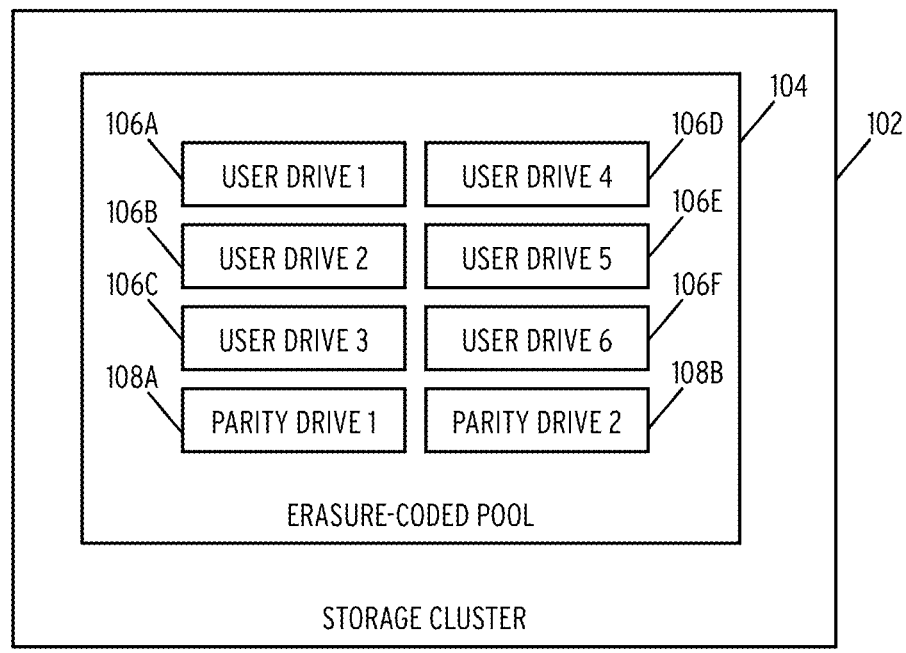
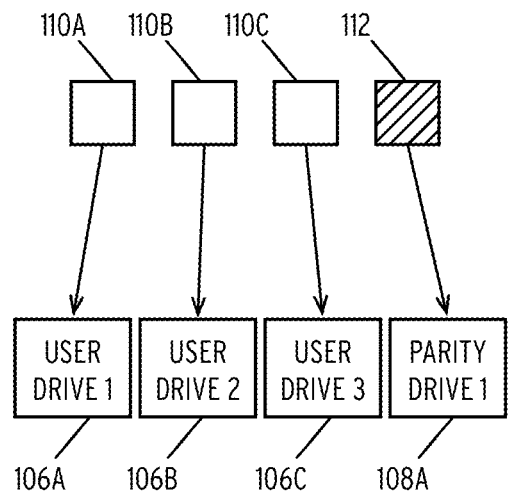
FIG. 1

ITERATIVE MESSAGE-PASSING DECODING WITH GLOBAL CODE EMBEDDED WITH LOCAL CODE IN TIME-DIVISION MANNER FOR FAULT TOLERANCE IMPROVEMENT

COPYRIGHT NOTICE

This application includes material that may be subject to copyright protection. The copyright owner has no objection to the facsimile reproduction by anyone of the patent disclosure, as it appears in the Patent and Trademark Office files or records, but otherwise reserves all copyright rights whatsoever.

BACKGROUND

The disclosed embodiments are directed toward digital decoding and, specifically, to cooperative decoding in hyperscale data clusters.

A hyperscale data center employs storage nodes in the form of storage clusters. A storage cluster may include one or more storage devices organized into storage pools. These storage devices are used to support storage requirements of, for example, network applications.

To support high performance applications, a level of redundancy is needed to ensure that the failure of a single drive does not negatively impact downstream applications. One approach is to replicate data across drives. Thus, a single item of data is stored in separate, non-overlapping storage devices. The deficiency of this approach is that the amount of storage increases linearly with the amount of data stored. Since the amount of data used by network applications grows exponentially, the amount of storage devices needed to support this scheme grows exponentially and is thus impractical in terms of energy needed, costs of storage devices, and scalability.

Another approach is to organized storage devices in erasure coded pools. Erasure coded pools have the advantage of only storing data once. To support this reduced storage, additional computational complexity is required. However, the tradeoff is generally preferable to replicated systems. In an erasure coded pool, data is segmented into individual symbols. These symbols are then distributed to different storage devices. For example, a data word (ABCD) may be split into separate symbols (A, B, C, D) and stored in four separate drives.

To handle drive failures, a level of redundancy is needed to ensure that if one symbol is lost, it can be recovered. To accomplish this, many systems utilized Reed-Solomon (RS) encoding to add additional parity bytes to a given item of data (e.g., ABCD12, where 1 and 2 are parity symbols). The choice of parity bits dictates how many symbols can be recovered. For example, with two parity bits, a system can detect two errors and correct one. These symbols are then distributed to different storage devices, where oftentimes dedicated storage devices are used to store parity symbols. Current systems generally hard-decision RS decoding in order to detect and, if possible, correct erasures.

Current systems additionally utilize further encoding to protect against errors at various levels of the storage hierarchy. One current technique is to use low-density parity check (LDPC) algorithms to perform error correction on the data at the drive-level. In general, these algorithms are not concerned with the form of data encoded and decoded. Rather, LDPC codes are used simply to correct drive-level errors or channel errors. The data is then simply returned to the RS decoder and the RS decoder performs a hard decoding of the returned data. In some systems, RS decoding is skipped if all drives produced error-free data. Thus, the RS decoder is frequently unused. This results in hardware that consumes power and clock cycles while performing no useful work. Additionally, in current systems, the LDPC decoding employed is a hard-decision decoding. As is known, hard-decision coding is time-consuming and results in reduced response time for read requests.

BRIEF SUMMARY

The disclosed embodiments remedy the above and other deficiencies of existing decoding systems. Specifically, the disclosed embodiments described an improve decoding architecture for distributing decoding work between global level erasure coding and drive-level error correction. To support this, the disclosed embodiments first utilize a soft-decision erasure decoder (e.g., a soft-decision RS decoder). The disclosed embodiments additionally utilize both an LDPC decoder and a MAP (maximum a posteriori)/SOVA (soft output Viterbi algorithm) detector to iteratively detect errors at the drive-level and assign associated log likelihood ratio (LLR) values for symbols stored on a given drive. These LLRs are fed to the erasure decoder which may then proactively generate a series of trials to execute with the soft-decision erasure decoder. Specifically, the LLRs are used to predict which symbols should be treated as erasures and the modified codeword is fed to the erasure decoder. In this manner, the system predicts the likely erasures. The erasure decoder may then feed the resulting decoded code word back to each drive such that the confidence of the decoded symbols may be used by other drives in future iterative drive-level decoding.

In one embodiment, a method is disclosed comprising decoding a first codeword at a storage device using a detector and a decoder, the first codeword comprising a set of symbols from a first set of codewords; assigning, via the decoding, a set of confidence levels for each symbol in the first codeword; transmitting, by the storage device, the confidence levels to an iterative decoder; generating, by the iterative decoder, a second codeword based on the set of confidence levels, the second codeword excluding at least one symbol in the set of symbols; and iteratively decoding, by the iterative decoder, the second codeword using an erasure decoder; and transmitting, by the iterative decoder, soft information generated by the erasure decoder to the storage device for subsequent decoding by the storage device.

In another embodiment, a system is disclosed comprising a storage device comprising a detector and a decoder, the storage device configured to decode a first codeword using the detector and decoder, the first codeword comprising a set of symbols from a first set of codewords, and assign, via the decoding, a set of confidence levels for each symbol in the first codeword; a time-division scheduler configured to transmit the confidence levels to an iterative decoder; and an iterative decoder configured to generate a second codeword based on the set of confidence levels, the second codeword excluding at least one symbol in the set of symbols, iteratively decode the second codeword using an erasure decoder, and transmit soft information generated by the erasure decoder to the storage device for subsequent decoding by the storage device.

In another embodiment, a storage device is disclosed comprising a detector configured to: identify at least one path through a Viterbi trellis to decode a received codeword, and calculate soft outputs for each step along the path; and a decoder configured to: receive, from the detector, the soft outputs, execute an iterative decoding procedure using the codeword and the soft outputs generated by the detector, generate a set of confidence values associated with each symbol of the codeword, and transmit the set of confidence values to an iterative decoder.

BRIEF DESCRIPTION OF THE FIGURES

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

FIG. 1 is a block diagram illustrating an erasure-coded storage cluster according to some embodiments of the disclosure.

DETAILED DESCRIPTION

Figure 2:
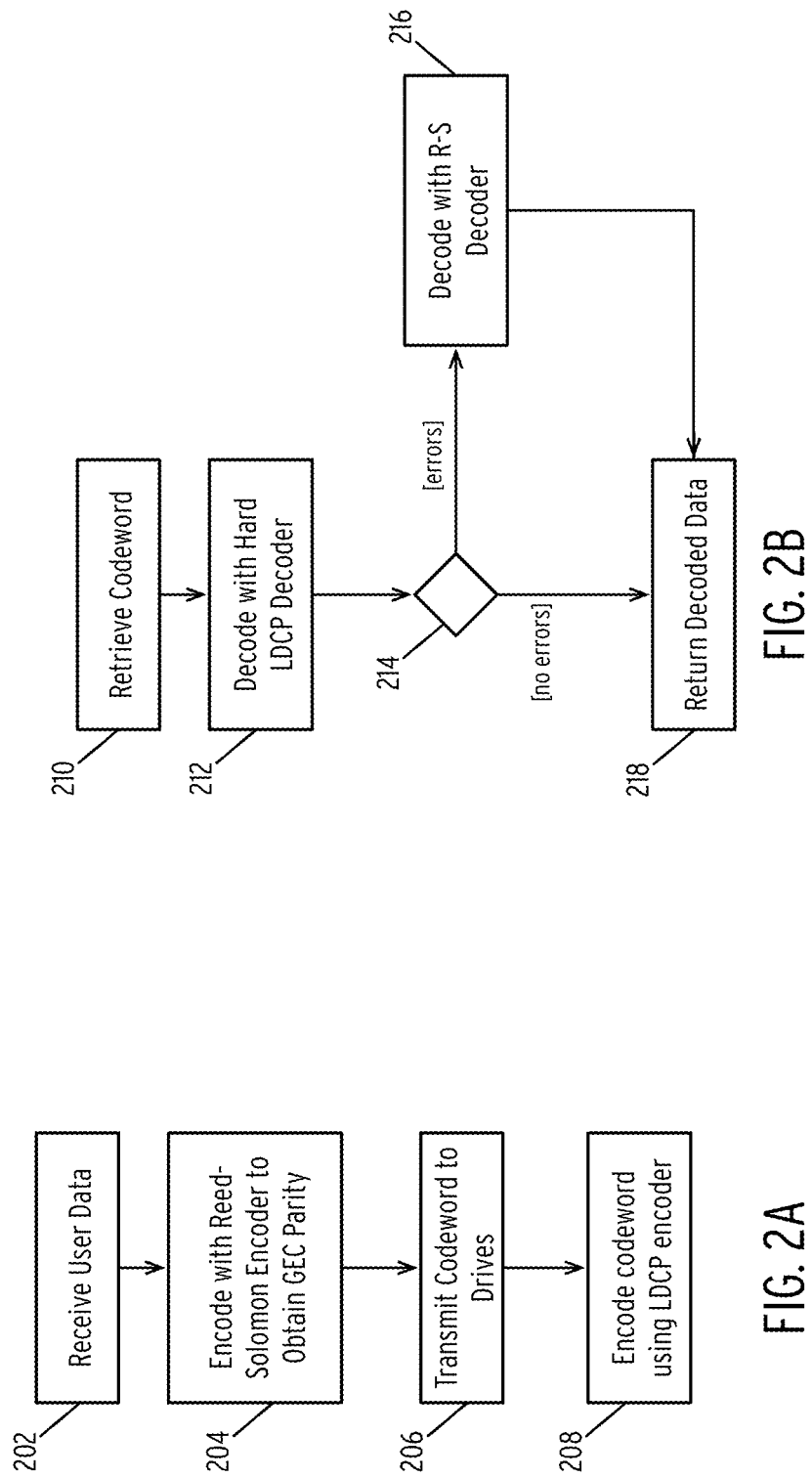
FIGS. 2A and 2B are flow diagrams illustrating write and read operations of an erasure-coded pool utilized by existing systems.

The present disclosure will now be described more fully hereinafter with reference to the accompanying drawings, which form a part hereof, and which show, by way of illustration, certain example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described below with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general-purpose computer to alter its function as detailed herein, a special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

These computer program instructions can be provided to a processor of: a general purpose computer to alter its function to a special purpose; a special purpose computer; ASIC; or other programmable digital data processing apparatus, such that the instructions, which execute via the processor of the computer or other programmable data processing apparatus, implement the functions/acts specified in the block diagrams or operational block or blocks, thereby transforming their functionality in accordance with embodiments herein.

For the purposes of this disclosure a computer readable medium (or computer-readable storage medium/media) stores computer data, which data can include computer program code (or computer-executable instructions) that is executable by a computer, in machine readable form. By way of example, and not limitation, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

FIG. 1 is a block diagram illustrating an erasure-coded storage cluster according to some embodiments of the disclosure.

In the illustrated embodiment, a storage cluster (102) may include one or more erasure-coded storage pools such as pool (104). In some embodiments, the cluster (102) may comprise a plurality of pools geographically distributed. In some embodiments, the pools may be distributed over a wide area, over a local area, or over a combination of local areas and wide areas. In general, a storage cluster (102) may be accessed by client devices (e.g., over a network) and store user data transmitted to the cluster.

The illustrated storage cluster (102) distributes data into one or more erasure-coded pools. Although illustrated as a single pool (104), the system may include multiple pools and no limit is placed on the number of pools The pool (104) includes a plurality of storage devices (106A-106F and 108A-108B). In some embodiment, each of the storage devices comprises a solid-state devices (SSDs) or similar persistent storage device. In some embodiments, the storage devices may comprise object storage devices (OSDs). The particular type of storage device is not intended to be limited.

As illustrated, the storage devices include user storage devices (106A-106F) and parity drives (108A-108B). In one embodiment, user storage devices (106A-106F) are configured to store data provided by users (or applications) whereas parity drives (108A-108B) are used to store the parity bits generated by an erasure encoding algorithm. The procedure is depicted graphically in the lower portion of FIG. 1. In that portion, a piece of user data is received and segmented into portions (110A-110C). Additionally, the user data comprising portions (110A-110C) is encoded using, for example, a Reed-Solomon ("RS") encoder to generate a parity portion 112. The portions (110A-110C) are distributed among separate user drives (106A-106c) and the parity portion (112) is distributed to a parity drive (108A).

The above description of partitioning and encoding allows the system to recover from drive failures. For example, if drive (106A) fails, portion (110A) would be lost or corrupted. However, the system can recover the portion (110A) using the other portions (110B-110C) and the parity portion (112).

In addition to the RS encoding, each drive (106A-106F and 108A-108B) may employ an independent error correction encoding system. In some embodiments, this system may include a low-density parity check (LDPC) encoding and decoding algorithm (and associated hardware). In this embodiment, each individual drive (106A-106F and 108A-108B) encodes and decodes incoming and outgoing data, respectively, using a separate error-correction routine (e.g., an LDPC routine). In some embodiments, the devices use soft information evolution to decode the data stored on a given drive and ensure error-free operations.

FIGS. 2A and 2B are flow diagrams illustrating write and read operations of an erasure-coded pool utilized by existing systems.

In step 202, the method receives user data. As described above, user data may comprise any data supplied for storage in an erasure-coded pool.

In step 204, the method encodes the user data with, for example, a RS encoder to obtain a global erasure-coding (GEC) parity portion. For purposes of illustration, a piece of user data may include symbols $A_1A_2A_3$. After RS encoding, the method generates a codeword containing symbols $A_1A_2A_3A_4$, where $A_4$ comprises a parity check portion.

In step 206, the method distributes the codeword to the erasure-coded pool for storage. As described above, the method may split the codeword into separate symbols ($A_1$, $A_2$, $A_3$, and $A_4$) and transmit each symbol to a separate drive. In one embodiment, symbol $A_4$ may be transmitted to a designated parity drive.

In step 208, the method encodes the received codeword using a LDPC encoder. In one embodiment, step 208 is performed at each drive on the received codeword. As described previously, a received codeword may include portions of various codewords (e.g., portions $A_1$, $B_1$, $C_1$, $D_1$, where $B_1$, $C_1$, $D_1$ correspond to portions of other RS-encoded codewords. In one embodiment, the result of step 208 is an LDPC codeword comprising RS-encoded portions $A_1$, $B_1$, $C_1$, $D_1$ and a parity portion $P_1$.

In step 210, the method begins decoding a codeword stored on a given drive by retrieving the codeword from the drive. In one embodiment, step 210 may be executed in response to a file system command, network request, or other instruction to retrieve data at a given address.

In step 212, the method decodes the codeword using a hard LPDC decoder. As known in the art, a "hard" decoder is on that produces a binary output (e.g., a symbol is either correct or incorrect). In general, a hard decoder operates on binary values (a one or zero). In contrast, a soft decoder (also referred to as a soft-decision decoder) uses a continuous range of values as inputs, in the form of log likelihood ratios (LLRs). While soft-decision decoding provides improved decoding performance, the use of hard decoders is common due to the reduced complexity of designing a hard decoder.

In step 214, the method determines if the decoding of the LPDC codeword was successful. If so, the method returns the decoded codeword (step 218). Alternatively, if the method detects an error in the LPDC decoding, the method proceeds to perform RS decoding (step 216) to correct the errors using the parity portions (or user data portions) stored on other devices.

As discussed previously, the use of each drive utilizing an independent hard-decision LPDC decoding routine results in a time-consuming decoding process. This time consumption necessarily impacts the performance of the drive, and when combined, the overall erasure-coded pool and storage cluster. On the other hand, the erasure-coding decoder (e.g., the RS decoder) is idle for most of a read operation. Thus, the erasure-coding decoder is underutilized and inefficient.

Figure 3:
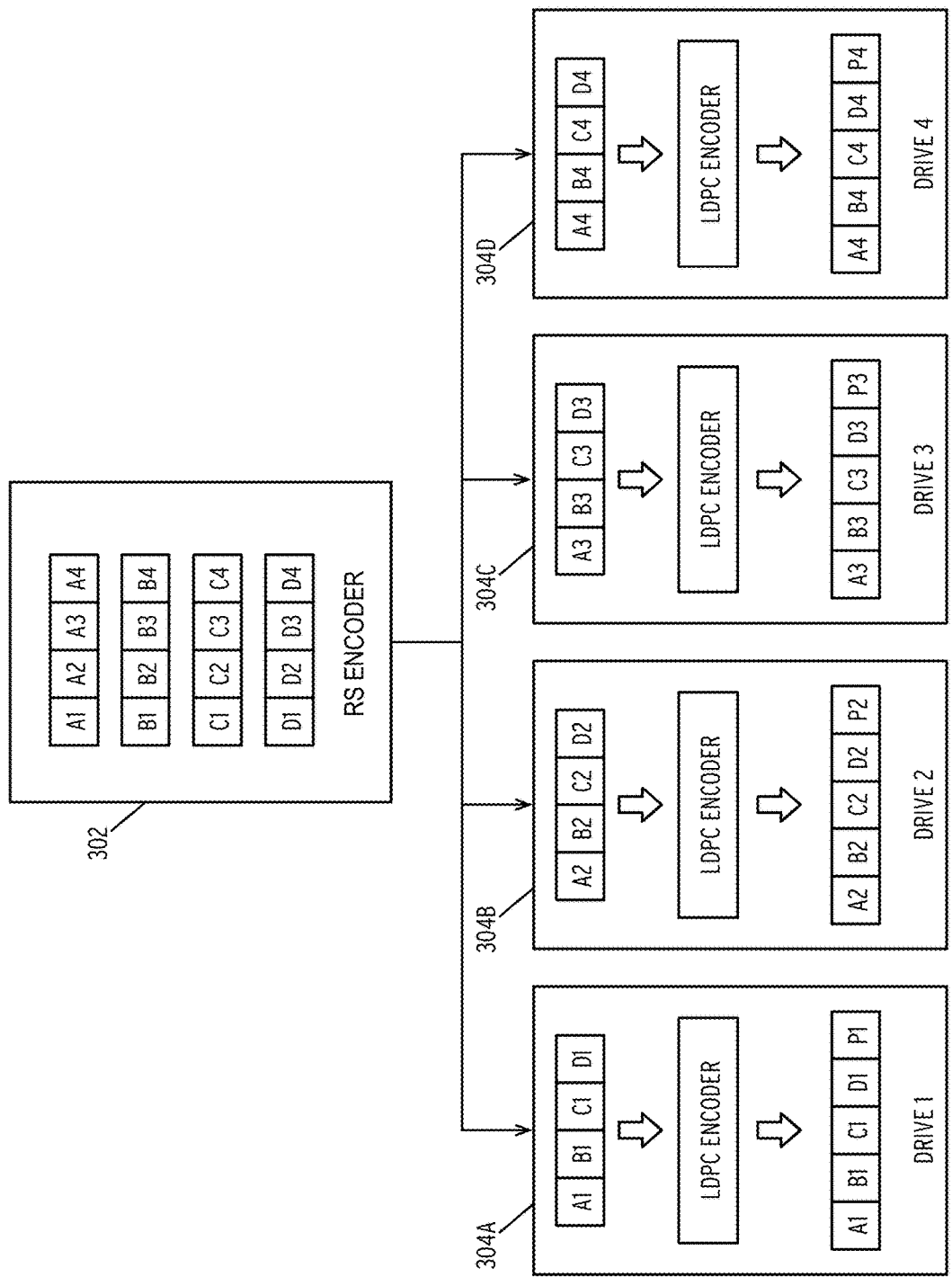
FIG. 3 is a block diagram illustrating an erasure-coded partitioning system according to some embodiments of the disclosure.

FIG. 3 is a block diagram illustrating an erasure-coded partitioning system according to some embodiments of the disclosure.

As illustrated, user data ($A_1A_2A_3$, $B_1B_2B_3$, $C_1C_2C_3$, $D_1D_2D_3$) is received by the RS encoder (302) and is RS-encoded to generate codewords $A_1A_2A_3A_4$, $B_1B_2B_3B_4$, $C_1C_2C_3C_4$, $D_1D_2D_3D_4$ which comprise the original user data plus parity portions generated by the RS encoder. These codewords are partitioned into separate symbols and each symbol is distributed among drives (304A-304D). Thus, drive 1 (304A) receives portions $A_1B_1C_1D_1$, drive 2 (304B) receives portions $A_2B_2C_2D_2$, drive 3 (304C) receives portions $A_3B_3C_3D_3$, and drive 4 (304D) receives portions $A_4B_4C_4D_4$. The portions received by each drive are referred to as partitioned codewords.

Each partitioned codeword is then input into an LDPC encoder to generate a final codeword to be stored on the drive. For example, drive 1 (304A) encodes the partitioned codeword $A_1B_1C_1D_1$ to generate the final codeword $A_1B_1C_1D_1P_1$ where $P_1$ represents a parity portion of the final codeword.

In one embodiment, the RS encoder (302) may comprise a standalone processing device. The RS encoder (302) may include processing units (CPUs) in communication with a mass memory. Mass memory may include a RAM module and other storage means. Mass memory illustrates another example of computer storage media for storage of information such as computer-readable instructions, data structures, program modules or other data. Mass memory stores a basic input/output system ("BIOS") for controlling low-level operation of client device. The mass memory may also store an operating system for controlling the operation of RS encoder (302). It will be appreciated that this component may include a general purpose operating system such as a version of UNIX, or LINUX™, or a specialized client communication operating system such as Windows Client™, or the Symbian® operating system. The operating system may include, or interface with a Java virtual machine module that enables control of hardware components and operating system operations via Java application programs.

Similarly, each storage device/drive (304A-304D) may include one or more processors or microcontrollers controlling access to the underlying disk or disks. For example, a given drive may include a physical storage medium (e.g., hard disk platters, solid-state NAND Flash storage, etc.) and one or more components (e.g., microcontrollers, microprocessors, etc.) controlling access to and from the physical medium. In some embodiments, the decoders and detectors may be implemented in the microcontrollers or microprocessors. In some embodiments, the detectors and decoders may be implemented as standalone application-specific integrated circuits (ASICs) or as field-programmable gate arrays (FPGAs). In this embodiment, a microcontroller or processor at a drive may utilize the ASIC/FPGA to perform the decoding operations discussed herein.

Figure 4:
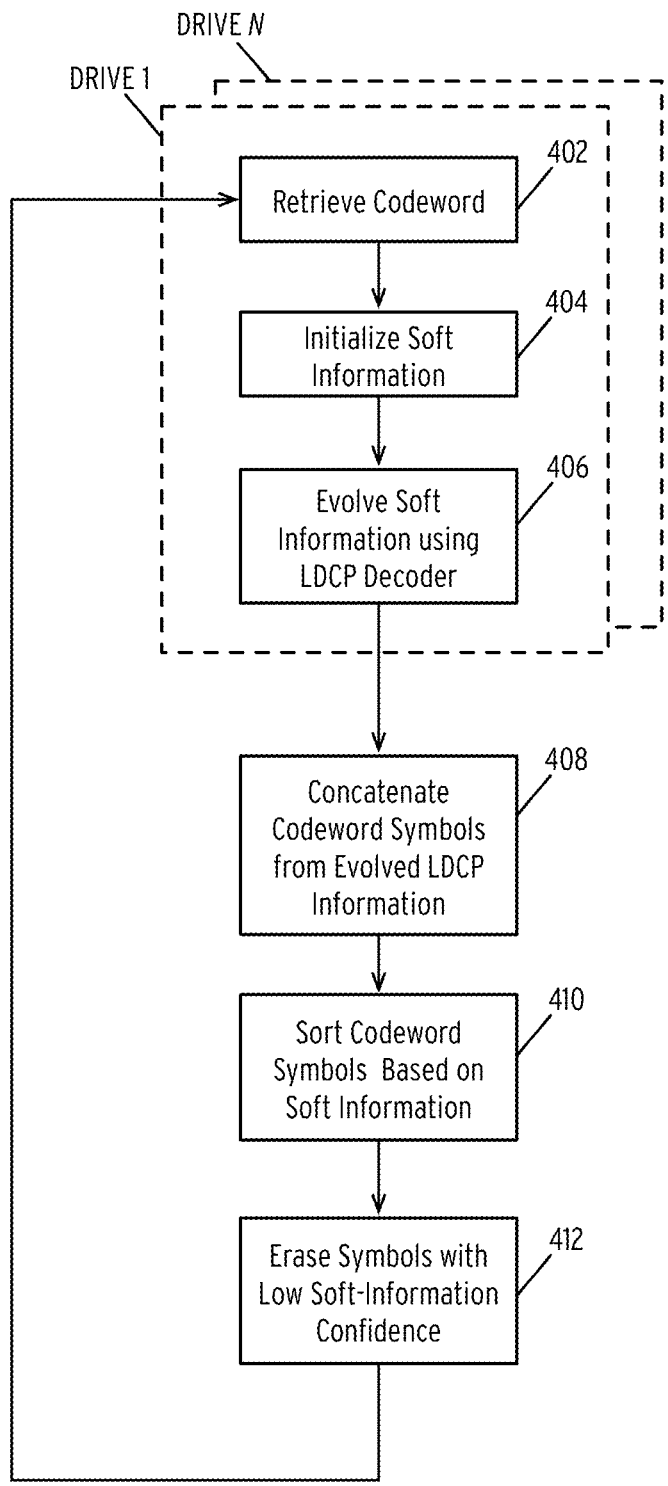
FIG. 4 is a flow diagram illustrating a method for iterative message-passing decoding with global code embedded with local code according to some embodiments of the disclosure.

FIG. 4 is a flow diagram illustrating a method for iterative message-passing decoding with global code embedded with local code according to some embodiments of the disclosure.

In step 402, the method retrieves a codeword from a given drive. As described above, the codeword may comprise a codeword encoded using a one-pass RS encoding procedure. In this procedure data enters the RS encoding system and is processed stage-by-stage by the RS encoder sequentially until written to the drive.

In contrast to current systems, the method in FIG. 4 does not use a hard-decision decoding scheme but rather utilizes a soft-information, iterative decoding mechanism, described in more detail herein.

In step 404, the method initializes soft information for the decoding process. In one embodiment, initializing soft information comprises extracting an initial confidence level associated with the codeword read in step 402. In one embodiment, the codeword read in step 402 may include a LLR associated with each returned symbol. That is, the method receives a confidence level (between 0 and 1) for each symbol (e.g., $A_1B_1C_1D_1P_1$) in the retrieved codeword.

In step 406, the method runs a local decoding procedure to evolve the initial soft information. In one embodiment, the local decoding procedure comprises an iterative message-passing algorithm used to perform belief propagation on the initial soft information. As known in the art, the method may utilize Tanner graphs or other structures to pass messages between bit nodes and check nodes of the parity check message associated with a given LDPC code used by the method.

In one embodiment, the method may execute step 406 until the soft information for each symbol exceeds a pre-defined threshold. Alternatively, the method may re-execute step 406 until the soft information for each symbol equals one. Alternatively, or in conjunction with the foregoing, the method may execute step 406 until a pre-defined period or number of iterations has been reached.

As this point, the method has generated a codeword $A_1B_1C_1D_1$, and a set of LLRs for each symbol in the codeword. Each drive may then transmit the codeword and the LLRs to an RS decoder for further processing.

In step 408, the method concatenates the portions of each codeword to reform the original RS-encoded codewords (e.g., $A_1A_2A_3A_4$ as illustrated in FIG. 3)

As illustrated, steps 402-406 are performed at a given drive and may be performed in parallel on multiple drives. The results of processing in step 402-406 are transmitted to a global RS decoder which executes steps 408-412.

In step 410, the method sorts the codeword symbols of the re-concatenated codewords by the received soft information. As described above, in one embodiment, the soft information comprises a set of LLRs between zero and one. Thus, in step 410, the method sorts the decimal LLR values.

In step 412, the method erases the symbols having low soft information values.

As described above, a low soft information value (e.g., a low LLR) indicates that the decoding procedure performed by the LDPC decoders in the individual drives may represent an incorrect symbol. Thus, in step 412, the method removes those symbols having low soft information values, thus only retaining those symbols having high LLR values. In the illustrated embodiment, the erasure of low soft information values is similar to the erasure of a value in a traditional erasure decoding scheme. Thus, in some embodiments, the method may attempt to rebuild the erased codeword symbols using the RS decoder and the bits of the codeword (including parity bits).

As illustrated in FIG. 4, the method may repeat steps 402-412 in multiple iterations. That is, in one embodiment, the RS-decoded codeword may be transmitted back to the LDPC decoder in each drive. In one embodiment, the method may again segment the symbols of the codeword. Details of the iterative nature of the method illustrated in FIG. 4 are described further herein.

Figure 5:
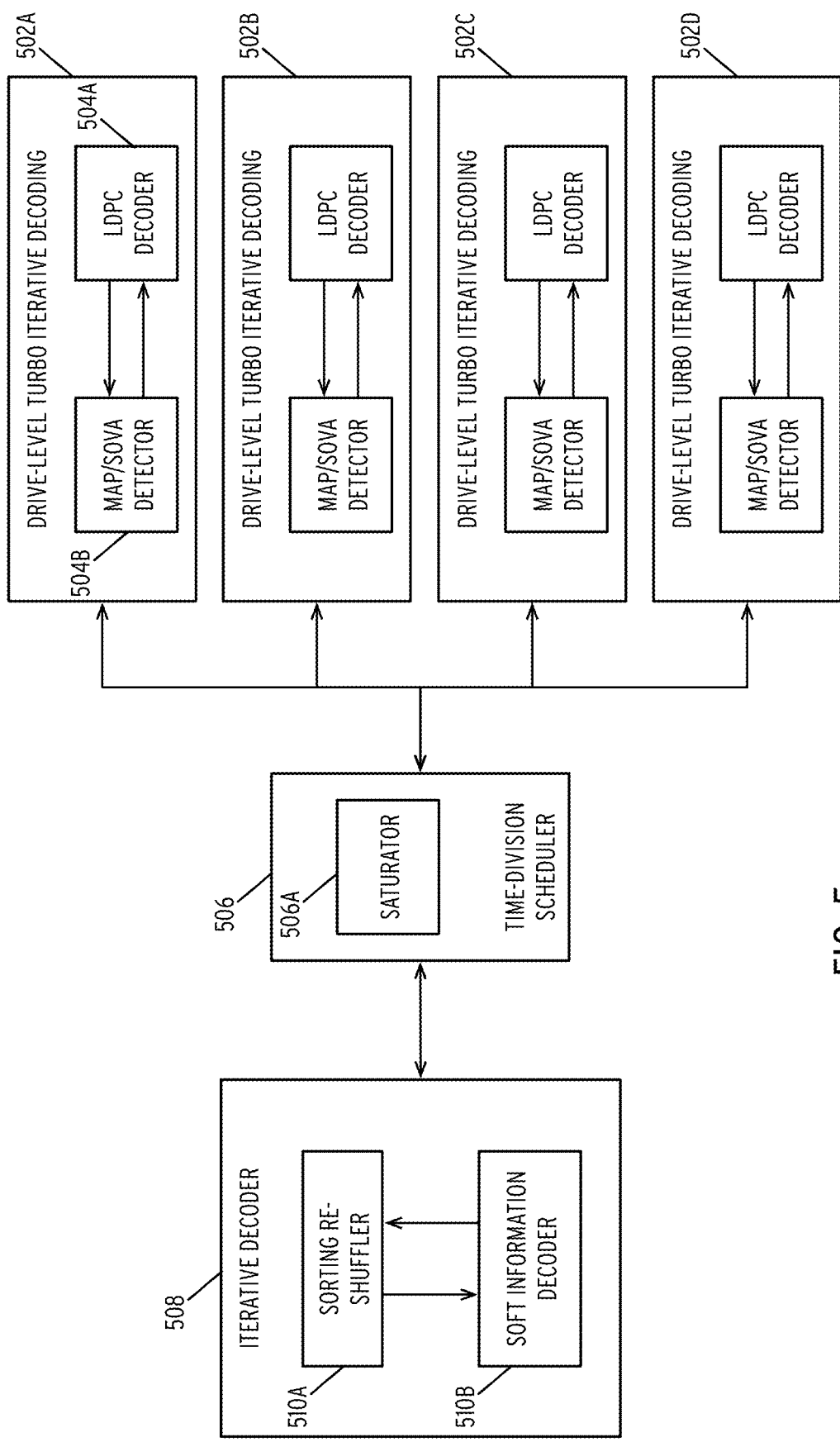
FIG. 5 is a block diagram illustrating a global iterative decoding system according to some embodiments of the disclosure.

FIG. 5 is a block diagram illustrating a global iterative decoding system according to some embodiments of the disclosure. The system includes a plurality of drives (502A-502D), a time-division scheduler (506), and an iterative decoder (508).

In one embodiment, a given drive (e.g., 502A) comprises a storage device as described previously. In addition to the hardware supporting the storage of data, the drives include hardware and/or software to support local decoding of encoded data stored on the drives. In the illustrated embodiment, a given drive (502A) includes an LDPC decoder (504A) and a MAP or SOVA detector (504B). As used herein, a "MAP" detector refers to maximum a posteriori detector and a "SOVA" detector refers to a soft output Viterbi algorithm detector.

In some embodiments, each drive may only use a SOVA detector. As known in the art, a SOVA detector utilizes a soft-information Viterbi algorithm to identify paths through a Viterbi trellis to decode codewords. The SOVA detector calculates the path with a maximum probability of correctness. Soft outputs are calculated for each step along the path. In alternative embodiments, a MAP detector may be used. In general a MAP detector is similar to a SOVA detector with the primarily difference being that a MAP detector utilizes a backward state processor. In general, a MAP processor selects an index that maximizes the a posteriori probability that a received codeword is correct.

In some embodiments, the SOVA and MAP detectors may be used together. In this embodiment, codewords are first processed by the SOVA detector in multiple iterations. After processing, frames with errors are forward to a MAP detector for further processing. In some embodiments, the soft output of the SOVA detector is used as the a priori input to the MAP detector.

As illustrated, the MAP/SOVA detector (504B) and LDPC decoder (504A) are connected in a loop. In one embodiment, the output of the MAP/SOVA detector (504B) is fed as input to the LDPC decoder (504A), and vice versa. As one example, during a first half of an iteration, the MAP/SOVA detector (504B) receives a codeword and attempts to calculate LLRs for each symbol in the codeword. In a first iteration, these LLRs may be based on channel observations. During a second half of the iteration, the MAP/SOVA detector (504B) forwards the codeword and LLRs to the LDPC decoder (504A) which performs a number of sub-iterations to decode the codeword. If the decoding succeeds, the drive may end the decoding process. Alternatively, in a second iteration, the LDPC decoder (504A) forwards the partially decoded codeword back to the MAP/SOVA detector (504B) for further processing. The calculated LLRs by the LDPC decoder (504A) may be used as the channel observations during the second detection phase.

As illustrated, the use of a MAP/SOVA detector (504B) and LDPC decoder (504A) may be exploited to double the throughput of the system. Specifically, each of the MAP/SOVA detector (504B) and LDPC decoder (504A) may operate on a unique processing object during a given iteration. Thus, each iteration involves the processing of two processing objects simultaneously.

Time-division scheduler (506) coordinates data transfer of decoded codewords from the drives (502A-502D) to iterative decoder (508). The details of the precise timing of transfers are discussed more fully herein and are incorporated herein by reference in its entirety. In general, as discussed above, the input to the decoding system in each drive is a received codeword with potential errors. The output of the drive-level decoding subsystem is a decoded codeword with LLRs for each symbol.

In one embodiment, the system illustrated in FIG. 5 may further include a one-pass Reed-Solomon encoder configured to encode a plurality of user data items to obtain a set of encoded symbols representing the user data items. In this embodiment, the time-division scheduler (506) may be further configured to interleave encoded symbols of the user data items to generate a plurality of interleaved codewords, the plurality of interleaved codewords including the first codeword. The time-division scheduler (506) may further be configured to transmit the first codeword to the storage prior to decoding the first codeword.

In one embodiment, time-division scheduler (506) is configured to monitor the decoding progress of the drives (502A-502D) and iterative decoder (508). In one embodiment, once the time-division scheduler (506) detects that one of the drives (502A-502D) or the iterative decoder (508) have completed decoding (or a pre-defined decoding window has expired), the time-division scheduler (506) swaps the data groups being processed by each respective component. That is, the time-division scheduler (506) swaps the group of data processed by iterative decoder (508) with the data group processed by drives (502A-502D).

Additionally, time-division scheduler (506), via saturator (506A), may be configured to update confidence saturations for symbols passed in messages between the drives (502A-502D) and iterative decoder (508). In the illustrated embodiment, the storage cluster knows which groups of data are associated with each drive (502A-502D), and consequently knows the locations of any errors if the corresponding drive malfunctions or the codeword is determined to include a decoding failure. When the failed codeword is spread into multiple other partner codewords (e.g., one LDPC codeword is spread into multiple RS codewords, or one RS codeword is spread into multiple LDPC codewords as well), from the origins of the spread fraction of the codeword and the result of the last decoding step, certain symbols can be identified as correct or incorrect. As described above and herein, a correct symbol is assigned to maximal confidence to accelerate the next decoding iteration. For incorrect symbols, what is known is the location, but the correct value at that location is unknown yet. In this case, the LLR denoting the confidence of the current sign is set as zero, which means this symbol has the equal likelihood to be all values in its range. By doing this reset of LLR, it can also accelerate the iterative decoding to remove the negative influence from the incorrect symbols. When the soft information is passed between the drives (502A-502D) and the iterative decoder (508), the symbols are adjusted during the message passing based on the former decoding result.

Iterative decoder (508) receives the symbols and LLRs from the drives (502A-502D). The iterative decoder (508) includes a sorting reshuffle (510A) and a soft information decoder (510B). In the illustrated embodiment, soft information decoder (510B) may comprise a soft-information RS decoder or similar decoder. In general, the soft information decoder (510B) receives the symbols from time-division scheduler (506) and decodes the symbols using the soft-information generated by the drives (502A-502D). The results of the soft decoding are transmitted to the sorting reshuffle (510A) which reorders the symbols based on the soft information and identifiers symbols that should be erased based on the low confidence level represented by the soft information (i.e., the LLRs).

In general, the arrangement of the soft information decoder (510B) and the reshuffle (510A) allows for a decoding procedure with a higher confidence than a hard decoder. The confidence is especially higher when the number of symbols to be erased exceeds the minimal distance of the code (e.g., RS code) used by the iterative decoder (508). Specifically, the soft information from the drives (502A-502D) assists the sorting of those most likely candidates to be erased and then decoded. For example, if there are $m_1$ symbols that are potentially incorrect, but the erasure decoding capacity is to corrected $m_2$ (where $m_2 < m_1$) wrong symbols, the reshuffle (510A) is configured to pick the $m_2$ symbols with the lowest confidence, erase them, and only then perform the soft information decoding via decoder (510B).

In some embodiments, there may exist multiple erasure candidates. In this embodiment, the system is configured to identify and erasure multiple permutations of erasures and try each permutation for decoding. In some embodiments, the system may set a predefined time window to try permutations.

Figure 6:
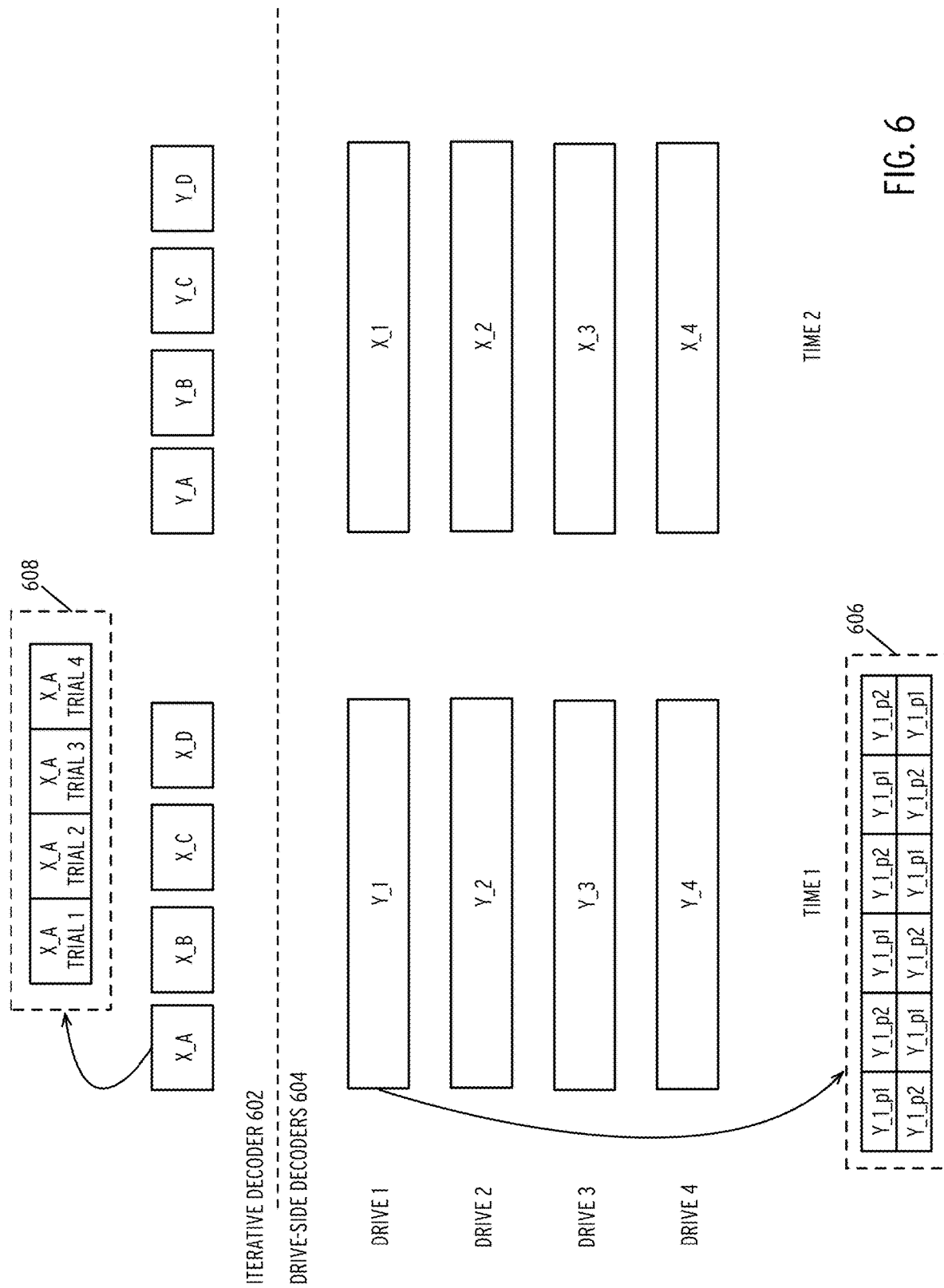
FIG. 6 is a diagram illustrating the swapping of decoding results between a drive-level decoder and a global erasure decoder according to some embodiments of the disclosure.

FIG. 6 is a diagram illustrating the swapping of decoding results between a drive-level decoder and a global erasure decoder according to some embodiments of the disclosure.

As illustrated, iterative decoder (602) and drive decoder (604) operate in parallel. The illustrated embodiment illustrates the processing of each decoder at $time_1$ and $time_2$. In operation, the illustrated process continues until decoding is successful or a codeword cannot be decoded.

Iterative decoder-side codewords are denoted with alphabetical subscripts (A, B, C, D) whereas drive-side codewords are indicated by numerical subscripts (1, 2, 3, and 4). As described previously, codewords processed by iterative decoder (602) comprise erasure-coded versions of user data. In contrast, decoder-side codewords comprise interleaved codewords synthesized from the erasure-coded versions. Details of the interleaving are illustrated in FIG. 3 and the disclosure accompanying FIG. 3 is incorporated herein by reference in its entirety.

In the illustrated embodiment, "X" and "Y" are utilized to illustrate groupings of data processed by the system. Thus, the iterative decoder-side codewords X_A, X_B, X_C, X_D are non-interleaved versions of the drive-side codewords X_1, X_2, X_3, X_4. Similarly, drive-side codewords Y_1, Y_2, Y_3, and Y_4 are interleaved versions of iterative decoder-side codewords Y_A, Y_B, Y_C, and Y_D. As illustrated, decoding by the iterative decoder (602) occurs in parallel with drive-side decoder (604) however each side operates on a different grouping of data.

Within each drive 1-4, the LDPC turbo decoding routine (discussed in more detail supra) works on two code words (denoted as Y_1_p1 and Y_1_p2) using, for example, the MAP/SOVA decoder and LDPC local decoder subsystem discussed previously. As described above, this subsystem operates iteratively as illustrated in sequence (606). In this sequence (606), only decoding six iterations are illustrated, however more or fewer iterations may be utilized in actual practice. In general, the number of iterations of sequence (606) may be configured to match the number of iterations of sequence (608). Notably, the sequence (606) includes two rows of operations. The top row may correspond to processing by a MAP/SOVA detector while the bottom row corresponds to processing by a LDPC decoder. As illustrated, the codewords (Y_1_p1, Y_1_p2) are repeatedly alternated for processing as described in FIG. 5.

The Figure additionally illustrates sequence (608) which represents the iterative decoding trials performed in parallel with sequence (606). In one embodiment, the sequence (608) comprises a number of trials. Each trial represents a codeword (X_A) wherein one or more symbols in codeword are erased (e.g., via a reshuffle) and based to a soft-information decoder (E.g., a soft-information RS decoder). The results of the decoding are stored and the trial having the highest confidence level across the symbols is used as the output of the iterative decoder (602). As illustrated, processing on the iterative decoder-side may be performed in series while processing on the drive-side is performed in parallel. After processing is completed in timer, the system swaps data groups X and Y as illustrated in $time_2$.

Figure 7:
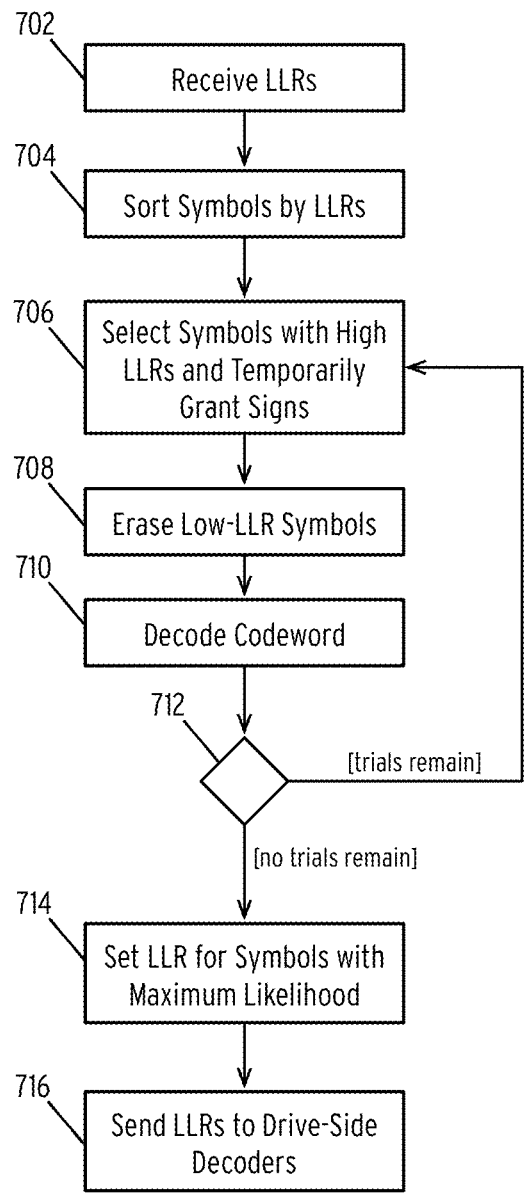
FIG. 7 illustrates a method for performing erasure decoding using soft-information decoding outputs according to some embodiments of the disclosure.

FIG. 7 illustrates a method for performing erasure decoding using soft-information decoding outputs according to some embodiments of the disclosure.

In step 702, the method receives LLR data for a plurality of code symbols in a given codeword. In step 702, the method may also receive the codeword symbols along with the LLRs. For example, the method may receive a codeword having symbols S1 through S8 and a set of LLRs represented by LLR1 through LLR8. As described above, these symbols were previously decoded by local LDPC decoding at individual drives. Since the symbols were interleaved, the method may receive symbols S1 and S2 (and LLRs LLR1 and LLR2) from a first drive, S3 and S4 (and LLRs LLR3 and LLR4) from a second drive, S5 and S6 (and LLRs LLR5 and LLR6) from a third drive, and S7 and S8 (and LLRs LLR7 and LLR8) from a fourth drive.

In one embodiment, in step 702 the method reconstructs the codewords from the individual symbols received from each drive. In one embodiment, the storage cluster operating the method includes an index of symbols stored on each drive and uses this index to re-concatenate the symbols.

In step 704, the method sorts the received symbols based on the LLRs. As known in the art, a given LLR comprises a continuous value. Thus, in step 704 the method sorts the symbols by the LLRs in ascending or descending order.

In step 706, the method identifies a number of bits having high LLRs and temporarily grants the sign of the LLR to the symbols identified. In one embodiment, granting the sign of the LLR comprises identifying that the symbol does not include an error. Thus, in step 706 the method temporary sets a symbol with a high LLR as being properly decoded, thus having maximum confidence.

In step 708, the method erases those symbols having low LLR values. In one embodiment, erasing the symbols comprises setting the confidence level of the low-LLR symbols to a minimal confidence level. In other embodiments, the method may simply discard the symbols for decoding. In the illustrated embodiment, the erasure of symbols may be temporary.

In step 710, the method decodes the codeword. As described above, the method may utilize an iterative RS decoder to decode the codeword that contains one or more erased symbols. In one embodiment, the decoding may succeed. In that case the method may proceed directly to step 714.

In step 712, the method determines if one or more trial remain to be executed. In some embodiments, the number of trials may be bounded only by a successful decoding. In other embodiments, the method may utilize a fixed number of trials to execute. In general, a trial refers to a permutation of symbols with signs granted in step 706 and symbols erased in step 708. In this manner, the method attempts to decode various permutations of codewords containing erased symbols. As known in the art, the LLR values represent a likely confidence. Thus, depending on the state of decoding, a given high or low LLR may be in error. Thus, the method attempts to try as many permutations of low and high LLRs as possible within a given time window. In this manner, the method can compensate for a partial decoding at the drive-level, thus reducing the number of iterations at each drive.

Once the method determines that decoding is successful, or no more iterations remain, the method proceeds to step 714.

In step 714, the method sets a maximum confidence value for the symbols decoded in step 710. In some embodiments, if the method is unable to decode all symbols of the given codeword, the method may update the received LLR with an LLR generated during the iterative decoding in step 710.

In step 716, the method transmits the decoded symbols and the LLRs to the drive-side decoders. As described previously, the drive-side decoders may utilize the symbols decoded in step 710 and use the updated LLRs to re-execute the MAP/SOVA detector and LDPC decoding procedure discussed previously.

As illustrated in previous Figures, the codewords on the iterative decoder-side are orthogonal to the drive-side codewords. Thus, any convergence on either side improves the performance of the other side. For example, if a drive-side decoding system cannot reliably decode symbol $A_1$ (as part of codeword $A_1B_1C_1D_1$), the iterative decoder-side decoding system may be capable of decoding the codeword $A_1A_2A_3A_4$. In this case, the confidence of symbol $A_1$ may be set to a maximum value. Thus, when the drive-side decoding system attempts to decode $A_1B_1C_1D_1$ again, the drive-side decoding system may set the confidence of $A_1$ to a maximum value. Conversely, if the drive-side decoding system converges on a drive-side codeword, those symbols may be set to a maximum confidence level during processing by the iterative decoder.

For the purposes of this disclosure a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer readable medium for execution by a processor. Modules may be integral to one or more servers, or be loaded and executed by one or more servers. One or more modules may be grouped into an engine or an application.

Those skilled in the art will recognize that the methods and systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all of the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments of methods presented and described as flowcharts in this disclosure are provided by way of example in order to provide a more complete understanding of the technology. The disclosed methods are not limited to the operations and logical flow presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A method comprising:
   decoding a first codeword at a storage device using a detector and a decoder, the first codeword comprising a set of symbols from a first set of codewords;
   assigning, via the decoding, a set of confidence levels for each symbol in the first codeword;
   transmitting, by the storage device, the confidence levels to an iterative decoder;
   generating, by the iterative decoder, a second codeword based on the set of confidence levels, the second codeword excluding at least one symbol in the set of symbols;
   iteratively decoding, by the iterative decoder, the second codeword using an erasure decoder; and
   transmitting, by the iterative decoder, soft information generated by the erasure decoder to the storage device for subsequent decoding by the storage device.

2. The method of claim 1, further comprising: encoding a plurality of user data items using a one-pass Reed-Solomon decoder to obtain a set of encoded symbols representing the user data items.

3. The method of claim 2, further comprising:
   interleaving the set of encoded symbols to generate a plurality of interleaved codewords, the plurality of interleaved codewords including the first codeword; and
   transmitting the first codeword to the storage device prior to decoding the first codeword.

4. The method of claim 1, the decoding a first codeword at a storage device using a detector and a decoder comprising executing multiple iterations of decoding by the detector and the decoder, an output of the decoder providing an input to the detector and an output of the detector providing an input to the decoder.

5. The method of claim 4, the detector comprising a maximum a posteriori or soft output Viterbi algorithm detector, the decoder comprising a low-density parity check decoder.

6. The method of claim 5, the detector and decoder operating in parallel.

7. The method of claim 1, the generating a second codeword based on the set of confidence levels comprising:
   interleaving the set of symbols to form the second codeword; and
   sorting the set of symbols based on the set of confidence levels, the set of confidence levels comprising log likelihood ratio values generated by the detector and decoder.

8. The method of claim 1, further comprising
   updating the confidence levels associated with the symbols of the second codeword after iteratively decoding the second codeword;
   transmitting the updated confidence levels to the detector and decoder; and
   using the updated confidence levels during a subsequent decoding process executed by the detector and decoder.

9. The method of claim 1, the iteratively decoding the second codeword using an erasure decoder comprising executing multiple trials of decoding, each trial corresponding to a permutation of erased symbols in the second codeword.

10. A system comprising:
    a storage device comprising a detector and a decoder, the storage device configured to decode a first codeword using the detector and decoder, the first codeword comprising a set of symbols from a first set of codewords, and assign, via the decoding, a set of confidence levels for each symbol in the first codeword;

a time-division scheduler configured to transmit the confidence levels to an iterative decoder; and an iterative decoder configured to
generate a second codeword based on the set of confidence levels, the second codeword excluding at least one symbol in the set of symbols,
iteratively decode the second codeword using an erasure decoder, and
transmit soft information generated by the erasure decoder to the storage device for subsequent decoding by the storage device.

11. The system of claim 10, further comprising: a one-pass Reed-Solomon encoder configured to encode a plurality of user data items to obtain a set of encoded symbols representing the user data items.

12. The system of claim 11, the time-division scheduler further configured to:
interleave the set of encoded symbols to generate a plurality of interleaved codewords, the plurality of interleaved codewords including the first codeword; and
transmit the first codeword to the storage device prior to decoding the first codeword.

13. The system of claim 10, the storage device further configured to execute multiple iterations of decoding by the detector and the decoder, an output of the decoder providing an input to the detector and an output of the detector providing an input to the decoder.

14. The system of claim 13, the detector comprising a maximum a posteriori or soft output Viterbi algorithm detector and the decoder comprising a low-density parity check decoder.

15. The system of claim 14, the detector and decoder operating in parallel.

16. The system of claim 10, the iterative decoder further configured to:
interleave the set of symbols to form the second codeword;
sort the set of symbols based on the set of confidence levels, the set of confidence levels comprising log likelihood ratio values generated by the detector and decoder.

17. The system of claim 10, the time-division scheduler further configured to:
update the confidence levels associated with the symbols of the second codeword after iteratively decoding the second codeword;
transmit the updated confidence levels to the detector and decoder, the updated confidence levels used by the storage device during a subsequent decoding process executed by the detector and decoder.

18. The system of claim 10, the iterative decoder further configured to execute multiple trials of decoding, each trial corresponding to a permutation of erased symbols in the second codeword.

* * * * *